(12) United States Patent
Hellum

(10) Patent No.: US 6,433,633 B1
(45) Date of Patent: Aug. 13, 2002

(54) AUTOMATIC GAIN CONTROL SYSTEM WITH SIGNAL PRESENCE CONDITIONING

(75) Inventor: Pål Longva Hellum, Sandvika (NO)

(73) Assignee: Telefonaktiebolaget L M Ericsson (Publ) (SE)

( * ) Notice: Subject to any disclaimer, the term of this patent is extended or adjusted under 35 U.S.C. 154(b) by 0 days.

(21) Appl. No.: 09/711,609

(22) Filed: Nov. 13, 2000

(30) Foreign Application Priority Data

Nov. 15, 1999 (NO) ............................................ 19995609

(51) Int. Cl.⁷ ................................................. H03G 3/20
(52) U.S. Cl. ........................................ 330/136; 330/141
(58) Field of Search ............................... 330/129, 132, 330/136, 140, 141, 254

(56) References Cited

U.S. PATENT DOCUMENTS

| | | | |
|---|---|---|---|
| 3,848,194 A | * 11/1974 | Nishimura et al. | 330/136 |
| 5,016,205 A | 5/1991 | Shumway | 364/715.01 |
| 5,369,711 A | * 11/1994 | Williamson, III | 381/104 |
| 6,201,443 B1 | * 3/2001 | Tanji | 330/254 |

FOREIGN PATENT DOCUMENTS

JP          03175708 A  *  7/1991  .................. 330/278

* cited by examiner

*Primary Examiner*—Robert Pascal
*Assistant Examiner*—Khanh Van Nguyen
(74) *Attorney, Agent, or Firm*—Jenkens & Gilchrist

(57) ABSTRACT

An automatic gain control system comprises a system input and a system output, detecting means adapted to convert an input signal into a signal level indication, which detecting means includes a rectifier and a 60 tap FIR filter with a Chebychev window, an AGC state machine coupled to receive said indication and output a gain level control signal, which state machine is adapted to adjust said gain level control signal when there is a signal present on the system input, a variable gain amplifier having an input coupled to receive the input signal from the system input, an output coupled to the system output, and a control input coupled to receive said gain level control signal for controlling the gain of said variable gain amplifier in order to keep the output signal level substantially constant as the level of the input signal varies.

9 Claims, 3 Drawing Sheets

AUTOMATIC GAIN CONTROL SYSTEM WITH SIGNAL PRESENCE CONDITIONING

The invention is applicable to any audio related applications where audio level variations are a problem.

This invention is solving a problem inherent in AGC amplifiers. An AGC amplifier will achieve maximum gain during periods where there is no signal. This results in a pumping effect as seen from the user. The gain will vary a lot as the signal goes through periods of silence and signal presence.

PRIOR ART

There are many AGC implementations, both analogue and digital, known today.

U.S. Pat. No. 5,734,974 describes a direct conversion radio receiver comprising a stepwise variable gain control. The output signal (audio) from the detector/low pass filter is fed into an AGC detector. In the AGC detector the signal is integrated to form an AGC signal indicative of the average level of the output signal. A state machine is coupled to the AGC detector and generates a control signal for controlling a stepwise variable gain control circuit. This circuit generates a signal to control the gain of an RF amplifier in the receiver. The state machine introduces a delay (hysteresis function) in the gain control at a raising or falling input signal. However, the output signal is compared against a maximum or minimum allowed level prior to a stepwise gain change as a result of a new state function in the state machine.

SUMMARY OF THE INVENTION

Briefly the present invention provides a new and improved AGC amplifier which shows no or little pumping effects. It is very easily implemented, e.g. in a DSP, and is very easily controlled, e.g. as to attack/release levels and times.

This object of the present invention is achieved in a system as defined in the appended claim 1. Further embodiments of the invention appear from the following dependent claims.

BRIEF DESCRIPTION OF THE DRAWINGS

The invention will now be described in closer detail with reference to the appended drawings, in which.

DETAILED DESCRIPTION OF THE INVENTION

Figure 1:
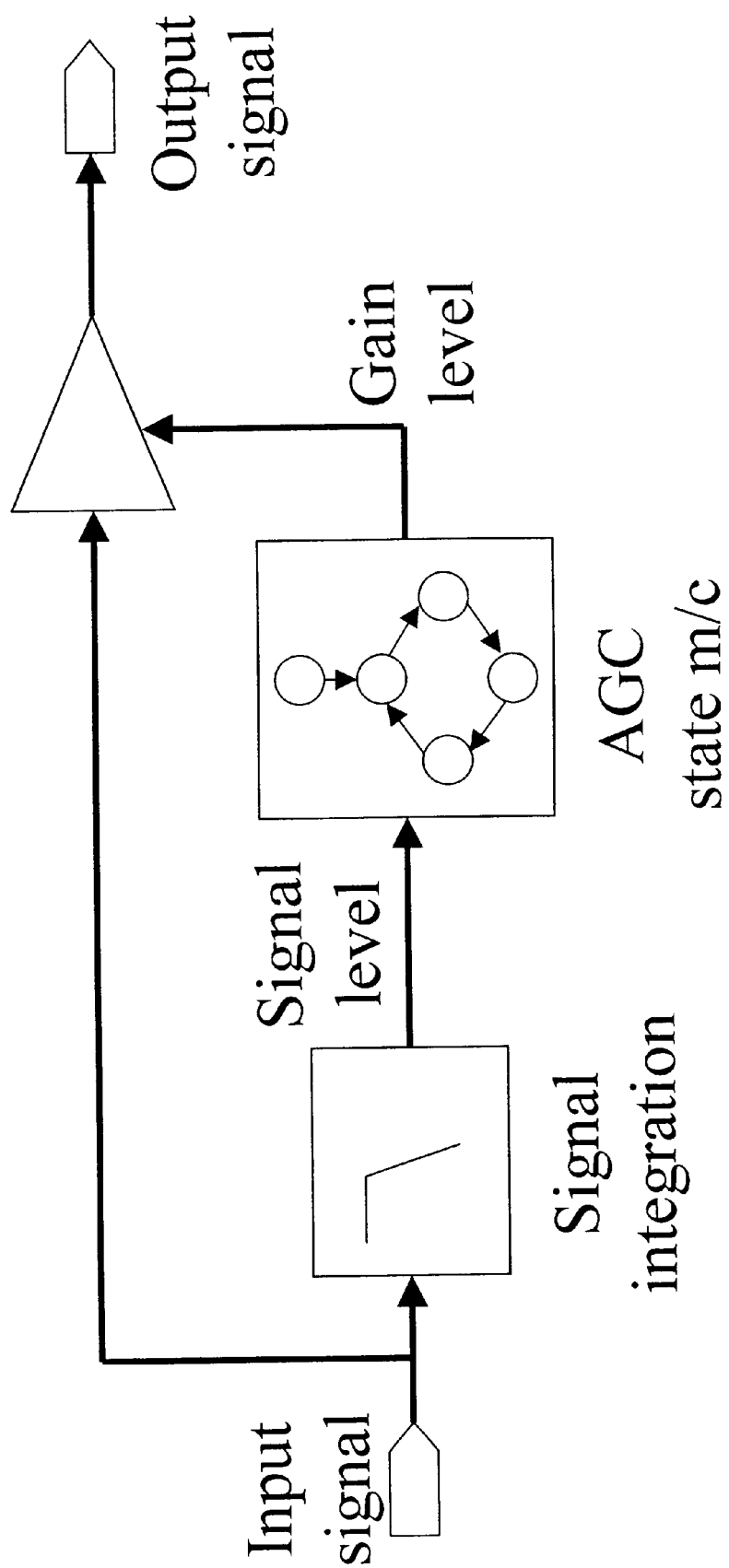
FIG. 1 shows the inventive AGC amplifier, with the separate elements depicted as building blocks.
Figure 2:
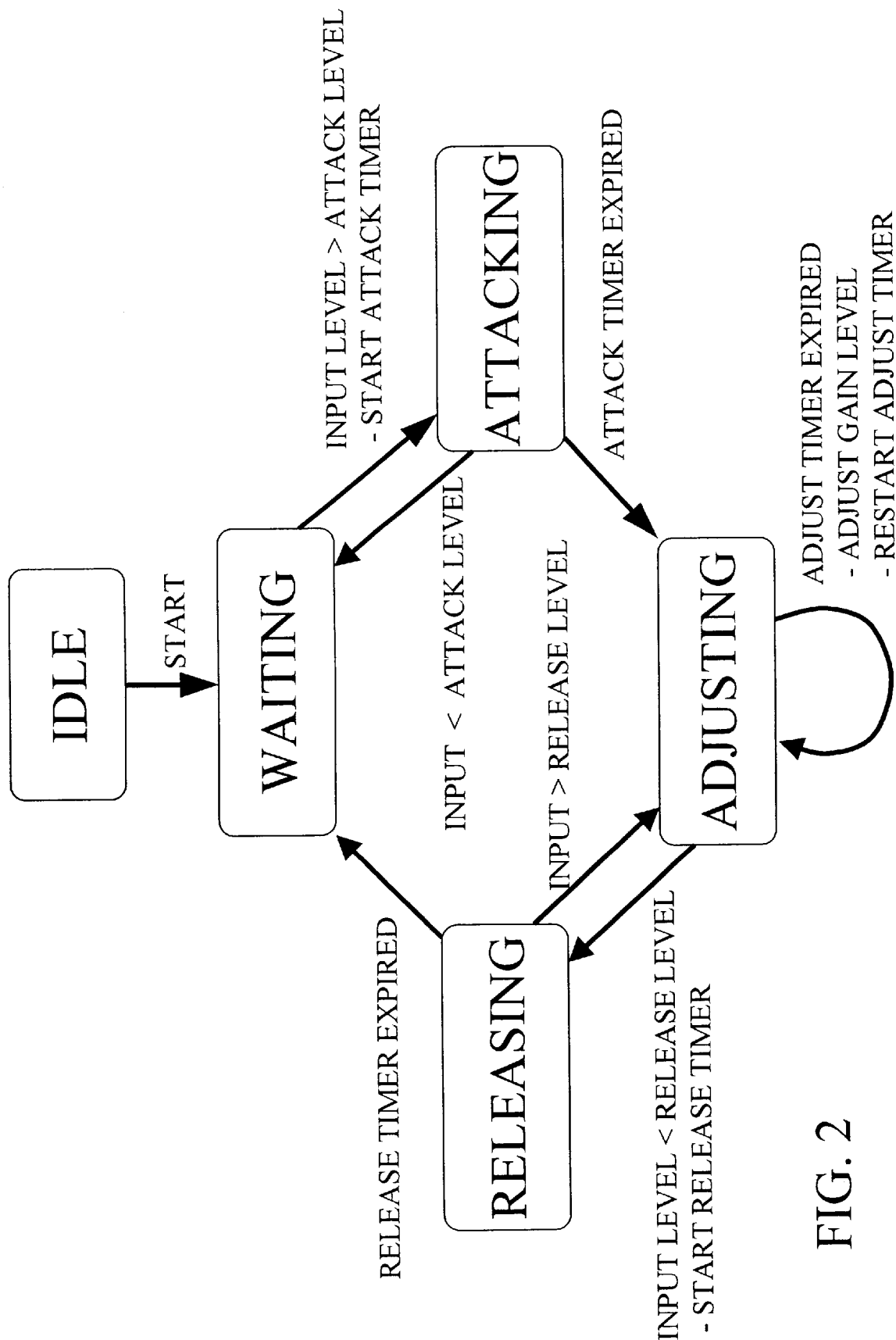
FIG. 2 is a functional diagram of the state machine.

The invention consists of the building blocks shown in FIG. 1. The input signal is fed to a gain controlled amplifier, which delivers a level regulated version of the signal at the output. This amplifier is controlled by the circuitry in the signal path below, consisting of a low pass signal integrating filter and a state machine. The input signal is first rectified and integrated in a low pass filter to give a signal level indication. This signal level is the basis for the behaviour of the AGC state machine. If the signal level is high enough to indicate signal presence then the gain is adjusted so as to give a constant output level. This state machine is shown in greater detail in FIG. 2.

The integration function is implemented through the use of a 60 tap FIR filter with a Chebyshev window. He cut-off frequency was set to 5 Hz with a stopband ripple of –60 dB.

The reason for this choice is that a FIR filter gives a predictable and fast step-response. The Chebychev window gives a steep cut-off and controllable stop band ripple.

Figure 3:
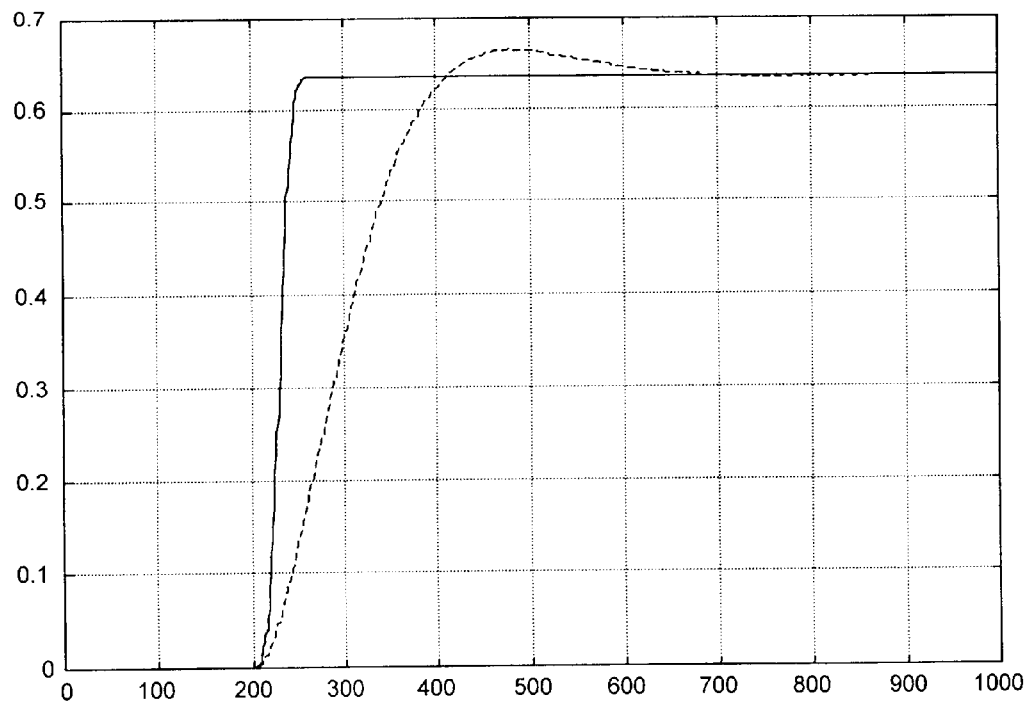
FIG. 3 shows a comparison of the pulse response to a 300 Hz tone of a 60 tap Chebychev FIR filter (solid line) and a $2^{nd}$ order IIR Butterworth filter (dotted line). The units are taps horizontally and signal level vertically.

FIG. 3 compares the impulse response to a 300 Hz tone of a 60 tap Chebychev FIR filter (solid line) and a $2^{nd}$ order IIR Butterworth filter (dotted line). As can be seen the impulse response for the FIR filter is as expected.

Figure 4:
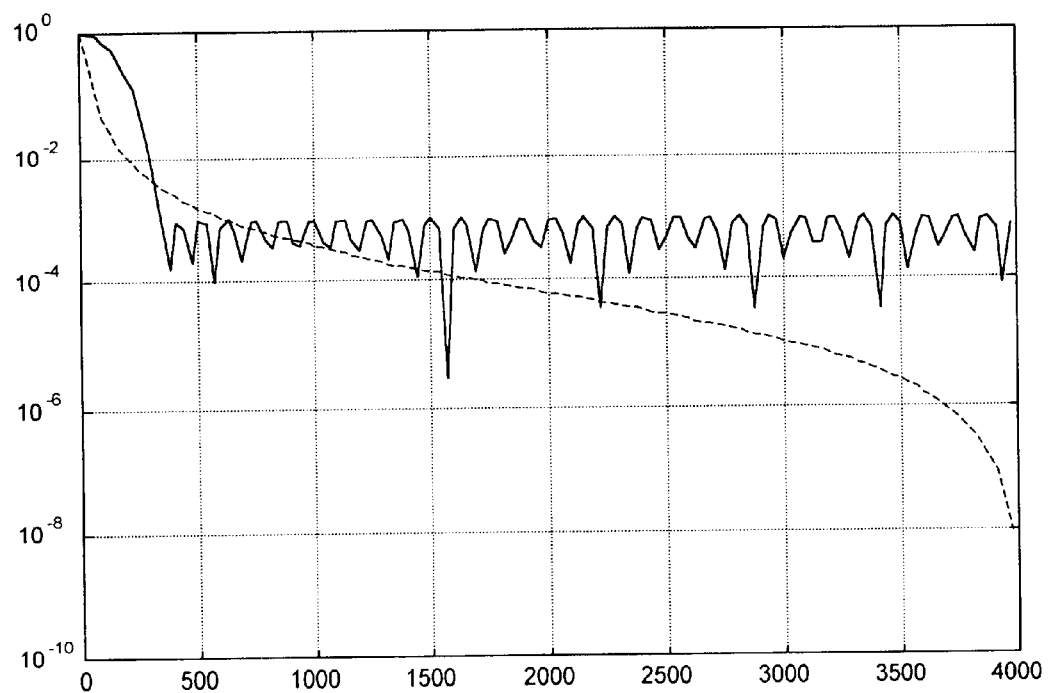
FIG. 4 gives a comparison of the frequency response of a 60 tap Chebychev FIR filter (solid line) and a $2_{nd}$ order IIR Butterworth filter (dotted line). The units are frequency (Hz) horizontally and signal attenuation vertically.

FIG. 4 shows the frequency response for the same filters. As can be seen the IIR filter gives the best cut off but the FIR filters give a flatter stopband floor.

When the state machine initially is started the transition from IDLE to WAITING is done. If the signal level is greater than a threshold—ATTACK_LEVEL, then the transition to ATTACKING is made. If the signal remains stable above ATTACK_LEVEL for a time greater than the ATTACK_TIME then the transition is made to the ADJUSTING state.

In this state, i.e. with a stable signal level above the ATTACK_LEVEL the gain is adjusted so as to keep the output level stable. The adjusting is controlled by 4 parameters MAX_GAIN, GAIN_INCREASE, GAIN_DECREASE and TARGET_LEVEL. The gain will be increased by GAIN_INCREASE repeatedly, spaced by the adjusting timer period, e.g. every 125 µsec. corresponding to the standard sampling interval in digital telephone systems. This is repeated until either the output level is equal to or greater than the TARGET_LEVEL or until the gain is equal to the MAX_GAIN. In this embodiment the output level is not actually measured but calculated as CURRENT_GAIN*INPUT_LEVEL. CURRENT_GAIN denotes the current gain setting of the amplifier while INPUT_LEVEL is the level of the input signal. In the same way, if the output level is above TARGET_LEVEL the gain will be decreased by GAIN_DECREASE e.g. every 125 µsec. until the output level is equal to or less than TARGET_LEVEL.

This procedure may be expressed by the following logic relationship:

if (CURRENT_GAIN*INPUT_LEVEL<TARGET_LEVEL) and (CURRENT_GAIN<MAX_GAIN)

CURRENT_GAIN=CURRENT_GAIN*GAIN_INCREASE else if

CURRENT_GAIN*INPUT_LEVEL>TARGET_LEVEL

CURENT_GAIN=CURRENT_GAIN/GAIN_DECREASE

If in this state the level drops below a threshold—RELEASE_LEVEL, then the gain adjusting stops and a transition to the state RELEASING is made. If the drop remains stable below RELEASE_LEVEL for a time greater than the RELEASE_TIME then the transition to WAITING is made.

This means that the gain adjusting is only performed when a signal is present, with the exception of the time it takes for the signal integrator to integrate the input signal.

The following parameters are all presentable and determined the behaviour of the AGC function:

ATTACK_LEVEL
ATTACK_TIME
RELEASE_LEVEL
RELEASE_TIME
MAX_GAIN
GAIN_INCREASE
GAIN_DECREASE
TARGET_LEVEL

What is claimed is:

1. An automatic gain control system having a system input and a system output, said automatic gain control system including:

detecting means for detecting the presence of an input signal from said system input and for converting said input signal into a signal level indication;

an AGC state machine coupled to receive said signal level indication and output a gain level control signal; and a variable gain amplifier having an amplifier input coupled to receive the input signal from the system input, an amplifier output coupled to the system output, and a control input coupled to receive said gain level control signal for controlling again of said variable gain amplifier in order to keep an output signal level substantially constant as a level of the input signal varies, wherein said AGC state machine includes at least a waiting state in which said gain of said variable gain amplifier is kept constant, and an adjusting state in which the gain of the variable gain amplifier is adjusted in order to keep the output signal level constant, and wherein said AGC state machine is adapted to pass from said waiting state to said adjusting state only when an input signal is present at the signal input, and to revert to said waiting state when said input signal disappears.

2. The system as claimed in claim 1, wherein said detecting means comprises a rectifying means and a low pass integrating filter.

3. The system as claimed in claim 2, wherein said low pass integrating filter comprises an FIR filter with a Chebychev window.

4. The system as claimed in claim 3, wherein said FIR filter comprises 60 taps.

5. The system as claimed in claim 1, wherein said AGC state machine is adapted to:

transit from said waiting state to a first intermediate state if the input signal level is greater than a first predetermined threshold, if the input signal level remains above said first predetermined threshold for a time greater than a first predefined time, a transition is made to the adjusting state, where the gain is adjusted so as to keep the output signal level stable, if the input signal level drops below a second predetermined threshold, a transition is made to a second intermediate state, and if the input signal level remains below said second predetermined-threshold for a time greater than a second predefined time, a transition is made to said waiting state.

6. The system as claimed in claim 5, wherein the adjusting of the gain in the adjusting state is performed until the output signal level is equal to or greater than a target level.

7. The system as claimed in claim 6, wherein the gain is repeatedly increased by a gain increase value until the output signal level is equal to or greater than said target level.

8. The system as claimed in claim 7, wherein if the output signal level rises above said target level, the gain is repeatedly decreased by a gain decrease value until the output signal level is equal to or below said target level.

9. The system as claimed in claim 8, wherein each of said first predetermined threshold, said second predetermined threshold, said first predefined time, said second predefined time, said gain increase value, said gain decrease value and said target level are individually controllable.

* * * * *